United States Patent
Luchinger et al.

(10) Patent No.: US 10,003,037 B2
(45) Date of Patent: Jun. 19, 2018

(54) OPTOELECTRONIC DEVICES COMPRISING SOLUTION-PROCESSABLE METAL OXIDE BUFFER LAYERS

(71) Applicant: Avantama AG, Stafa (CH)

(72) Inventors: Norman Albert Luchinger, Meilen (CH); Benjamin Hartmeier, Zurich (CH); Yi Hou, Erlangen (DE); Tobias Stubhan, Nuremberg (DE); Christoph Brabec, Nuremberg (DE)

(73) Assignee: Avantama AG, Stafa (CH)

( * ) Notice: Subject to any disclaimer, the term of this patent is extended or adjusted under 35 U.S.C. 154(b) by 0 days. days.

(21) Appl. No.: 15/550,439

(22) PCT Filed: Feb. 9, 2016

(86) PCT No.: PCT/EP2016/000220
§ 371 (c)(1),
(2) Date: Aug. 11, 2017

(87) PCT Pub. No.: WO2016/128133
PCT Pub. Date: Aug. 18, 2016

(65) Prior Publication Data
US 2018/0033984 A1  Feb. 1, 2018

(30) Foreign Application Priority Data

Feb. 12, 2015 (EP) .................................. 15000421

(51) Int. Cl.
*H01L 51/50* (2006.01)
*H01L 51/42* (2006.01)
(Continued)

(52) U.S. Cl.
CPC .......... *H01L 51/4273* (2013.01); *H01L 33/12* (2013.01); *H01L 51/0004* (2013.01);
(Continued)

(58) Field of Classification Search
CPC .................................................. H01L 51/0098
See application file for complete search history.

(56) References Cited

U.S. PATENT DOCUMENTS

2010/0012178 A1    1/2010  Yang et al.

FOREIGN PATENT DOCUMENTS

EP       1 847 575 A1    10/2007
WO       2014/161100 A1  10/2014

OTHER PUBLICATIONS

Kim et al., "High-Performance and Environmentally Stable Planar Heterojunction Perovskite Solar Cells Based on a Solution-rocessed Copper-Doped Nickel Oxide Hole-Transporting Layer", Advanced Materials, 2014, pp. 1-7.
(Continued)

*Primary Examiner* — Cheung Lee
(74) *Attorney, Agent, or Firm* — Renner, Otto, Boisselle & Sklar, LLP

(57) ABSTRACT

The present disclosure relates to the field of electronic devices, such as organic electronics, wherein said device comprises a substrate and a multitude of layers, wherein at least one of said layers is a buffer layer, wherein said buffer layer comprises metal oxide nanoparticles comprising physisorbed metal salts as described in the specification. The disclosure further provides for intermediate goods and materials suitable for manufacturing such electronic devices, to specific manufacturing methods and to specific uses.

20 Claims, 2 Drawing Sheets

(51) Int. Cl.
    *H01L 33/12*     (2010.01)
    *H01L 51/00*     (2006.01)

(52) U.S. Cl.
    CPC ...... *H01L 51/0007* (2013.01); *H01L 51/5048* (2013.01); *H01L 51/0047* (2013.01)

(56) References Cited

OTHER PUBLICATIONS

Liu et al., "Nickel Oxide Hole Injection/Transport Layers for Efficient Solution-Processed Organic Light-Emitting Diodes", Chemistry of Materials, vol. 26, 2014, pp. 4528-4534.

International Search Report for corresponding International Application No. PCT/EP2016/000220 dated Apr. 20, 2016.

Written Opinion of the International Searching Authority for corresponding International Application No. PCT/EP2016/000220 dated Apr. 20, 2016.

Kim et al., "Effect of ZnO:Cs2CO3 on the performance of organic photovoltaics", Nanoscale Research Letters, vol. 9, Jun. 27, 2014, 11 pages.

Dong et al., "Cesium carbonate as a surface modification material for organic-inorganic hybrid perovskite solar cells with enhanced performance", RSC Advances, vol. 4, No. 104, Nov. 6, 2014, pp. 60131-60134.

OPTOELECTRONIC DEVICES COMPRISING SOLUTION-PROCESSABLE METAL OXIDE BUFFER LAYERS

This application is a national phase of International Application No. PCT/EP2016/000220 filed Feb. 9, 2016 and published in the English language, and claims priority to European Application No. 15000421.6 filed on Feb. 12, 2015.

FIELD OF THE INVENTION

The present invention relates to the field of electronic devices, particularly optoelectronic devices. The invention further provides intermediate goods and materials suitable for manufacturing such devices, the invention also provides for specific manufacturing methods and for specific uses.

BACKGROUND

It is known to use buffer layers in organic electronics, such as organic light emitting diodes (OLED), organic photovoltaic cells (OPV cells) or perovskite type solar cells, in order to increase device efficiency and life-time. Such buffer layers comprise metal oxides, such as zinc-, titanium-, tungsten-, nickel-, niobium-oxides, or doped metal oxides, such as Al-doped ZnO ("AZO") or Cu-doped NiO. Generally, such metal oxides in particulate form are known. Typically, the above named oxidic buffer layers are manufactured by thermal evaporation under high vacuum or by wet-chemical (precursor based) methods, requiring a high temperature annealing step; which is disadvantageous in terms of low-cost, large-area manufacturing processing.

It is also known that organic solar cells (OPV) offer a promising approach for a low-cost and flexible photovoltaic technology with certified efficiencies exceeding 10%. Before widespread commercialization, large area production and stability issues have to be solved. For the reliable large area production with high yield and low shunts, thick, stable, robust and printable buffer layers are a prerequisite.

Generally, such metal oxides in particulate form are known. As discussed above, such oxidic layers are manufactured by thermal evaporation under high vacuum; which is disadvantageous in terms of low-cost, large-area manufacturing processing. Such processes, using comparatively high temperatures, e.g. by including an annealing step, are also disadvantageous in case the layer preceding the buffer layer is temperature sensitive. The present inventors thus identified a need to provide manufacturing processes for buffer layers, particularly metal oxide buffer layers, that are compatible with temperature sensitive layers/materials.

It is also known that $Cs_2CO_3$ significantly influences work function of metal oxides in buffer layers. In certain applications, this is considered disadvantageous, as the desired properties of metal oxides interfere with the properties of $Cs_2CO_3$. The present inventors thus identified a need to provide metal oxide buffer layers with low or even zero amounts of $Cs_2CO_3$.

Luechinger et al. (WO2014/161100) describe organic electronic devices, such as OLEDs and organic solar cells, comprising buffer layers with surface modified metal oxide nanoparticles. Further, the advantages of solution processable buffer layers are outlined. Although simple in manufacturing, through its all-solution-process, the devices disclosed therein show comparatively low performance.

Kim et al. (Adv. Mater., 2014, DOI: 10.1002/adma.201404189) describe perovskite-type organic solar cells comprising NiO and Cu-doped NiO buffer layers. Due to its manufacturing, the buffer layers are dense, i.e. not particulate. The devices show performances exceeding 15% PCE. Nevertheless it is considered disadvantageous that the metal oxide layers are applied by a wet chemical (precursor based) method and thus need to be thermally cured at very high temperatures. Accordingly, these devices are more difficult in manufacturing, as the remaining layers of the solar cells cannot withstand such high temperatures and thus need to be coated after the deposition of the buffer layer.

Liu et al. (Chem. of Mater., 2014, DOI: 10.1021/cm501898y) describe OLEDs comprising NiO hole transport layers. Again, due to its manufacturing, the buffer layers described in this document are dense and not particulate. It is further described that these precursor based layers need to be cured at temperatures of at least 275° C. and even as high as 500° C. Again, this is considered obstructive to the successful production of organic material based electronic devices.

Kim et al (Nanoscale Research Letters 2014, 9, 323) discuss the effect of $ZnO:Cs_2CO_3$ on the performance of organic photovoltaics. As stated in that document, the work function of ITO is decreased from 4.7 eV to 3.8 eV due to the modification by $Cs_2CO_3$. Such modification of the work function may, depending on the application, be beneficial or disadvantageous.

Yang et al (US2010/0012178) describe solution processable materials for electronic and electro-optic applications. To that end, the electro-optic device comprises an interfacial layer which is a blend of a metal oxide and at least one other material that provides at least one of a decrease in the work function or an increase of electrical conductivity compared to the metal oxide alone. Such other material being present in amounts of at least 10% and up to 120% and thus significantly influence the properties of the metal oxide.

Dong et al (RSC Adv 2014, 4, 60131) discloses the use of $Cs_2CO_3$ as surface modification material for hybrid perovskite solar cells.

SUMMARY

Thus, it is an object of the present invention to mitigate at least some of these drawbacks of the state of the art. In particular, it is an aim of the present invention to provide compositions suitable for thin film formation on a plurality of substrates. It is a further aim to provide manufacturing methods for thin films avoiding vapor phase processes and to provide improved electrical devices and intermediate goods. It is a still further aim to provide optoelectronic devices, and components therefore, that are high performing. It is a still further aim to provide optoelectronic devices, and components therefore, which are simple in manufacturing.

These objectives are achieved by a device as defined in claim 1 and an intermediate good as defined in claim 10 and the uses as defined in claim 13. Further aspects of the invention are disclosed in the specification and independent claims, preferred embodiments are disclosed in the specification and the dependent claims.

The present invention will be described in detail below. It is understood that the various embodiments, preferences and ranges as provided/disclosed in this specification may be combined at will. Further, depending of the specific embodiment, selected definitions, embodiments or ranges may not apply.

Unless otherwise stated, the following definitions shall apply in this specification:

The terms "a", "an", "the" and similar terms used in the context of the present invention are to be construed to cover both the singular and plural unless otherwise indicated herein or clearly contradicted by the context. Further, the terms "including", "containing" and "comprising" are used herein in their open, non-limiting sense. The term "containing" shall include both, "comprising" and "consisting of".

Percentages are given as weight-%, unless otherwise indicated herein or clearly contradicted by the context.

The term "electronic device" is known in the field. In the context of the present invention, any device comprising functional thin films is encompassed, including inorganic LEDs or inorganic solar cells; but specifically organic electronics as defined below.

The term "optoelectronic device" is known in the field and denotes electronic devices that source, detect or control light. Accordingly, such devices either convert an electrical signal into an optical signal or vice versa.

The terms "organic electronics", "organic electronic devices", "OLED", "OPV" are known in the field and relate to electronic devices comprising a "substrate" and a multitude of layers, wherein at least one layer is a "buffer layer" as defined below. In organic electronics at least one layer comprises organic substances, essential to the correct functioning of said devices. Depending on the remaining layers, its structure and connection, these devices serve a multitude of purposes, such as an OLED, an OPV cell, organic photo detector, or perovskite solar cell. The term LED comprises both, organic LEDs (OLEDs) where the active layer comprises organic electrolumineszent materials (polymers or small molecule), and Quantum dot LEDs (QLEDs), where the active layer comprises electrolumineszent quantum dots.

The term "Buffer layer" denotes an interface layer in electronic devices, typically in devices as discussed herein. Buffer layer is the general term for layers with a charge selective function such as hole transport (HTL), hole injection (HIL), hole extraction (HEL), electron transport (ETL), electron injection (EIL) or electron extraction (EEL). In the context of the present invention the term buffer layer is generally representing the different specific functions. A buffer layer is often also referred as charge selective layer or charge transport layer (CTL). Accordingly, the term buffer layer includes both, electron selective layers and hole selective layers.

The term "Substrate" denotes the layer on which the functional layers are applied on. The substrate may be transparent or non-transparent. Suitable materials include organic materials, such as polymers and inorganic materials, such as glass.

The term "physisorption" is known in the field and is defined as adsorption in which the forces involved are intermolecular forces (van der Waals or electrostatic forces) and which do not involve a significant change in the electronic orbital patterns of the species involved. (see: "International Union of pure and Applied Chemistry" (http://goldbook.iupac.org/P04667.html) In the context of the present invention it denotes the adsorption of a molecule or ion on a surface by either electrostatic or van der Waals attraction. In contrast to chemisorption, a physisorbed molecule does not alter its chemical properties upon adsorption. Accordingly, by physisorption neither are covalent bonds formed or broken nor are atoms ionized or deionized.

The term "Scattering particles" is known and describes materials that efficiently scatter light. Typically, scattering particles exhibit a high refractive index (such as >2.0, preferably >2.3) and a particle size in the range of the wavelength of visible light (such as 100-1000 nm, preferably 200-500 nm).

The term "Haze" is known; the haze of a thin film is physically defined as the intensity of the diffuse transmission divided by the total transmission through the thin film. Haze can be measured with an integrated sphere.

The term "active layer" denotes a layer which is photoactive and either converts light into electrical energy (light absorbing; e.g. solar cells) or converts electrical energy into light (light emitting; e.g. LED's). In the context of the present invention, active layers contain one or more active materials.

In a specific embodiment, the active layer of a solar cell comprises a fullerene-based compound such as PCBM (acceptor) and a second active material (donor).

In a further specific embodiment, the active layer of a LED comprises organic materials, such as polymers or small molecules, such as discussed in Geffroy et al (Polym Int. 55:572-582 (2006)).

In a further specific embodiment, the active layer of a LED comprises electroluminescent quantum dots, such as Perovskite type crystals as disclosed e.g. in Kovalenko et al (Nanoletters 2014, DOI: 10.1021/n15048779).

The term "active material" denotes materials which are photoactive and either have electron acceptor or electron donor properties. This includes photoactive polymers, photoactive small molecules, photoactive quantum dots, photoactive metal-organic perovskites as used herein.

The terms "Perovskite" and "Perovskite-type materials" are known in the field and are materials that exhibit the same crystalline structure as $CaTiO_3$. They generally relate to crystalline materials complying with structure $ABX_3$, whereby A and B are two cations of very different sizes; typically, A has a coordination number of 12 in respect to X, while B has a coordination number of 6 in respect to X. In the context of the present invention Perovskite-type materials for example include metal organic halide materials such as methyl-ammonium-lead-iodide ($CH_3NH_3PbI_3$) or methyl-ammonium-tin-iodide ($CH_3NH_3SnI_3$).

The term "nanoparticle" is known and particularly relates to solid amorphous or crystalline particles having at least one dimension in the size range of 1-100 nm. Preferably, nanoparticles are approximately isometric (such as spherical or cubic nanoparticles). Particles are considered approximately isometric, in case the aspect ratio (longest:shortest direction) of all 3 orthogonal dimensions is 1-2. In an advantageous embodiment, the nanoparticles have a mean primary particle size of 2-60 nm, preferably 5-30 nm (measured by $N_2$ adsorption method (BET) and calculated by the following formula $d=6/(\rho*A_{BET})$, where d equals the particle size, $\rho$ equals the material density and $A_{BET}$ equals the measured specific surface area).

The term "nanoparticle layer" denotes a film composed of nanoparticles. The thickness of the nanoparticle layer may vary over a broad range, but typically is 3-1000 nm, preferably 10-300 nm. If no scattering particles are present, the range is typically 3-1 000 nm, such as 3-30 nm for self-assembling monolayers. If scattering particles are present, the range is typically 100-20 000 nm preferably 1 000-10 000 nm. A nanoparticle layer can be composed of a monolayer of nanoparticles, thus having a thickness equal to the size of the used nanoparticles and thus defining a lower limit of the thickness. A nanoparticle layer can be composed of nanoparticles with a single size or with a bimodal or multimodal size distribution. Bimodal or multimodal size distributions are believed to result in a higher packing density of the nanoparticle layer. Further, the volume porosity of a nanoparticle layer typically is less than 95%, preferably less than 70%.

The term "Metal oxide nanoparticles" includes (i) nanoparticles of pure oxides, (ii) nanoparticles of doped oxides, (iii) mixed metal oxides and (iv) core shell nanoparticles, whereby the core and shell are composed of different oxides.

The term "AZO" is known in the field and includes Aluminum doped Zinc oxides meaning that the Aluminum is atomically dispersed in the Zinc oxide lattice (solid solution).

The term "solvent" is known in the field and in the context of the present invention particularly includes water and polar organic solvents such as alcohols, glycol ethers, nitriles, ketones, esters, ethers, aldehydes, sulfoxides (such as dimethylsulfoxide (dmso)), formamides (such as diemthylformamide (dmf)) and acetamides (such as dimethylacetamide (dma)). The above organic solvents can be substituted or unsubstituted and include linear, branched and cyclic derivatives. There can also be unsaturated bonds in the molecule. The above organic solvents typically have 1-12 carbon atoms, preferably 1-7 carbon atoms.

The terms "dispersant" and "dispersing agent" are known in the field and have essentially the same meaning. In the context of the present invention, these terms denote a substance, other than a solvent, which is used in suspensions of colloids to improve the separation of particles and to prevent agglomeration or settling. In the context of the present invention the terms "dispersant" and "dispersing agent" are used for the metal salts, stabilizing the nanoparticle suspensions disclosed herein The term "suspension" is known and relates to a heterogeneous fluid of an internal phase (i.p.) that is a solid and an external phase (e.p.) that is a liquid. In the context of the present invention, a suspension typically has a kinetic stability of at least 1 day (measured according to complete particle sedimentation). In an advantageous embodiment, the invention provides for a composition with (hydrodynamic size $D_{90}$ of less than 100 nm) a shelf-life of more than 7 days, particularly more than 2 months. The external phase typically comprises one or more solvents, such as water, alcohols and ketones and the like.

The term "solution-processing" is known in the field and denotes the application of a coating or thin film to a substrate by the use of a solution-based (=liquid) starting material. In the context of the present invention, solution processing relates to the fabrication of organic electronics and intermediate goods comprising thin nanoparticle films by the use of one or more liquid suspensions; typically the application of the suspension(s) is/are conducted at ambient pressure.

BRIEF DESCRIPTION OF THE DRAWINGS

The present invention will be better understood by reference to the figures.

FIG. 3A shows the structure as obtained by a nanoparticle deposition process, thus showing particulate metal oxide phases (2) and air in the form of pores (3) according to this invention. FIG. 3B shows the structure as obtained by either precursor based or vacuum deposition processes, thus showing a continuous/dense metal oxide phase (2) and air in the form of a varying amount of defects such as cracks or holes (3). Depending on the actual deposition process the amount of defects in 3B may vary significantly.

DETAILED DESCRIPTION

Figure 1:
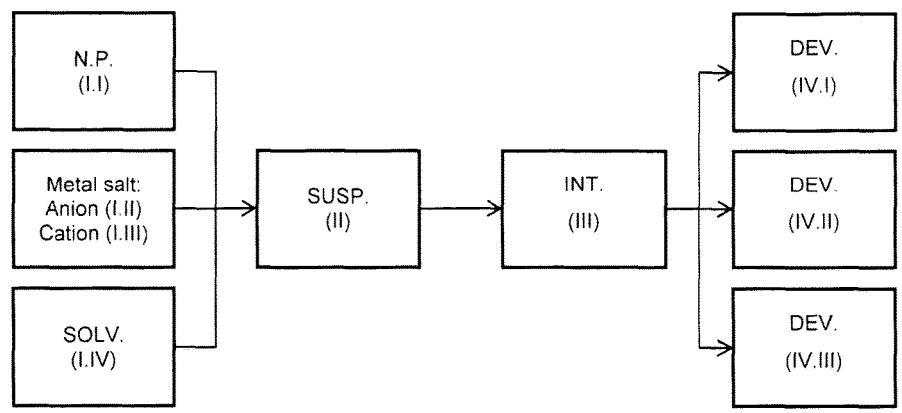
FIG. 1 outlines the various aspects of the present invention. In summary, the invention describes electronic devices from the group of organic electronics (DEV; IV.I-IV.III; 1$^{st}$ aspect of the invention) having specific buffer layer(s); intermediate goods (INT; III, 2$^{nd}$ aspect) suitable for manufacturing the above organic electronics; compositions in the form of a suspension (SUSP; II, 3$^{rd}$ aspect) suitable for manufacturing the above intermediate goods by wet phase processing. These compositions may be obtained by combining known starting materials, such as MOx nanoparticles (N.P.; I.I), metal salts (anion I.II and cation I.III) and solvents (SOLV; I.IV).
Figure 2:
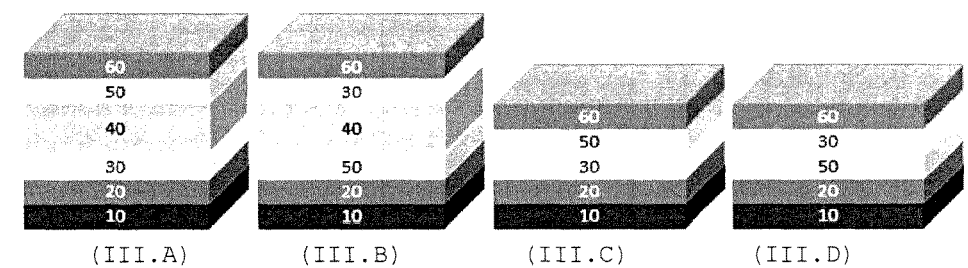
FIG. 2 shows a schematic setup of different types of intermediate goods (INT; III), useful for the manufacturing of organic electronics. According to figures III.A-III.D different sequences are shown where
(10) denotes a substrate [which can be transparent or non-transparent as well as organic (e.g. polymer) or inorganic (e.g. glass)],
(20) denotes an electrode [which can be transparent or non-transparent],
(30) denotes a first buffer layer,
(40) denotes an active layer [including e.g. a polymer, a small-molecule or a perovskite active material],
(50) denotes a second buffer layer [with opposite polarization compared to the first buffer layer],
(60) denotes a second electrode [which can independently of the first electrode be transparent or non-transparent]. The second buffer layer (50) may either have a composition according to the present invention, or may have a different composition, such as state-of-the art materials. The inventive intermediates may comprise further layers or consist of the layers as shown in this figure.
Figure 3:
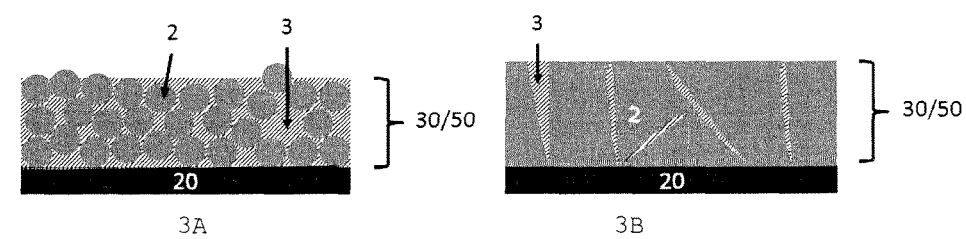
FIG. 3 schematically compares the internal structure of a buffer layer (30 or 50) on an electrode (20) depending on its manufacturing.
Figure 4:
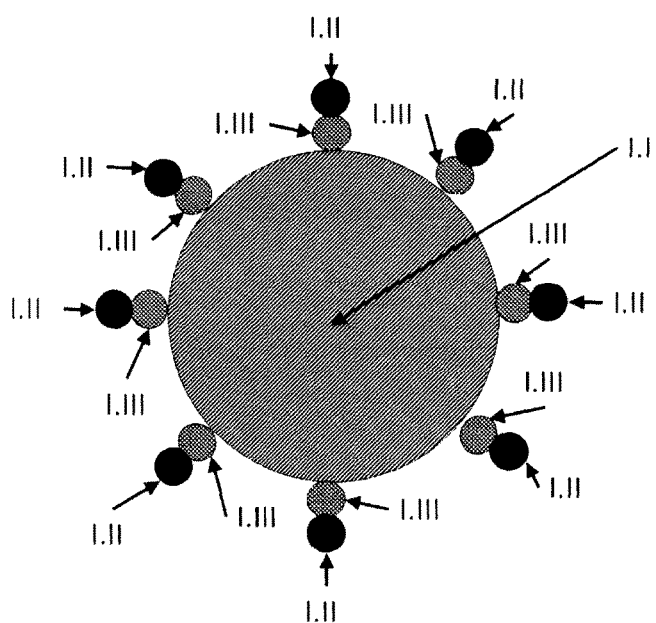
FIG. 4 shows a schematic illustration of a single metal oxide particle (I.I) as shown in FIG. 3, with the metal salt (cation I.III and anion I.II) adsorbed on its surface. Without being bound to theory, it is believed that the positively charged metal cation (I.III) will physisorb onto the negatively charged particle surface (I.I) and that the negatively charged anion (I.II) is present bound to the cation (as shown). In case the metal oxide particle is dispersed in a liquid phase, e.g. the inventive suspensions, the anion may also be spatially separated (not shown).

In a first aspect, the invention relates to an electronic device, particularly selected from the group of optoelectronic devices, wherein said device comprises a substrate and a multitude of layers, wherein at least one of said layers is a buffer layer, wherein said buffer layer comprises metal oxide nanoparticles, wherein on the surface of said nanoparticles metal salts as described herein are physisorbed.

In more general terms, the invention relates to buffer layers in an electronic device, said buffer layers having a specific and beneficial composition containing metal oxide nanoparticles as described. It was found that the present inventive buffer layers provide beneficial properties to the electronic devices because: (i) no post-treatment (e.g. plasma cleaning or annealing temperatures >150° C.) is required allowing an all-solution manufacturing process; (ii) only a very small amount of dispersing agent is needed thus leading to a high performance of the electronic devices.

This aspect of the invention shall be explained in further detail below.

The terms electronic devices and optoelectronic devices are defined above.

In one embodiment, the device is selected from the group of organic solar cells (OPV, including perovskite type solar cells), organic light emitting diodes (OLED), organic photodetectors and quantum dot LED (QLED); particularly OPV and OLED, very particularly OPV.

In a further embodiment, the invention relates to an OPV device with tandem architecture.

In a further embodiment, the invention relates to an OPV device with tandem architecture whereby an inventive layer of the present invention is part of the recombination layer.

In one embodiment, the buffer layer is selected from the group consisting of hole transport (HTL), hole injection (HIL), hole extraction (HEL), electron transport (ETL), electron injection (EIL) and electron extraction (EEL) layers, preferably HTL, HIL, HEL.

In one embodiment, the buffer layer is located on top of hydrophobic or hydrophilic organic materials, preferably PEDOT:PSS, photoactive polymers (absorbers or emitters) or photoactive small molecules (absorbers or emitters).

In one further embodiment, the buffer layer is located on top of a hydrophilic inorganic material, preferably ITO or silver (including a vacuum deposited dense Ag layer or a solution processed porous Ag nanowire layer).

In one embodiment, the top and/or bottom electrode of the device is a silver, a copper or a nickel electrode, particularly a Ag-, Cu- or Ni-nano wire electrode. The nano wires of such electrodes can be embedded in the hydrophilic or hydrophobic organic materials as defined above, particularly in PEDOT:PSS.

In one embodiment, the top and bottom electrodes are both made from metal nanowires. This embodiment provides transparent or semitransparent electronic devices. The nano wires of such electrodes can be embedded in the hydrophilic or hydrophobic organic materials as defined above, particularly in PEDOT:PSS.

In one embodiment, the top and/or bottom electrode is pure PEDOT:PSS.

In one further embodiment, the top and/or bottom electrode is a combination of PEDOT:PSS with a regular metal collector grid (such as an Ag-, Cu- or Ni-collector grid).

Metal Oxide Nanoparticles:

The term metal oxide nanoparticles is defined above.

In one embodiment, the nanoparticles are selected from the group consisting of pure metal oxides, preferably $Ni_zO_y$ (including NiO), $Zn_zO_y$ (including ZnO), $Ti_zO_y$, $W_zO_y$, $V_zO_y$, $Mo_zO_y$, $Y_zO_y$, $Ta_zO_y$, $Cu_zO_y$, $Zr_zO_y$, $Sn_zO_y$, $In_zO_y$ and $Nb_zO_y$. A particularly preferred pure metal oxide is NiO. A further particularly preferred pure metal oxide is ZnO. A further particularly preferred pure metal oxide is $Cr_zO_y$.

In one embodiment, the nanoparticles are selected from the group consisting of mixed metal oxides, preferably zinc containing mixed metal oxides, most preferably indium gallium zinc oxide (IGZO), indium zinc oxide (IZO), zinc tin oxide ($ZnSnO_3$). A further preferred mixed metal oxide is $BaSnO_3$.

In one embodiment, the nanoparticles are selected from the group consisting of doped metal oxides, particularly doped $Ni_zO_y$, $Zn_zO_y$, $Ti_zO_y$, $W_zO_y$, $V_zO_y$, $Mo_zO_y$, $Y_zO_y$, $Ta_zO_y$, $Cu_zO_y$, $Zr_zO_y$, $Sn_zO_y$, $In_zO_y$ and $Nb_zO_y$, most preferably $Ni_zO_y$, $Zn_xO_y$, $Ti_zO_y$, $In_zO_y$ and $Sn_zO_y$. Suitable dopants and amounts of dopants are known in the field. The term doped metal oxide relates to compositions of $MO_x$ where Metal (M) is substituted by one or more metals (="dopants"). The dopant atoms are incorporated into the $M_yO_x$ crystal lattice either substitutionally or interstitially forming a homogeneous single-phase (a "solid solution"). Specific examples include ITO (indium tin oxide; typical 90% $In_2O_3$: 10% $SnO_2$), ATO (antimony doped tin oxide; typical 90% $SnO_2$: 10% $Sb_2O_3$) and AZO (aluminum doped zinc oxide; typical 97% ZnO: 3% $AO_2O_3$). In the context of the present invention, separated multiphase systems (e.g. $MO_x+Fe_2O_3$) are not considered doped oxides. Doping of oxides can enable the fine tuning of the properties of the inventive thin films, such as electrical conductivity, work function and/or optical absorbance.

In a preferred embodiment said metal oxides are doped with 0.001-30 wt %, preferably 0.01-15 wt %, most preferably 0.1-10 wt % (with respect to the metal), by one or more metals.

In a preferred embodiment, said dopant atoms are selected from the group consisting of transition metals, alkaline metals and earth-alkaline metals.

Metal Salt:

According to the present invention, metal salts are physisorbed on the surface of the nanoparticles. The term physisorbed is defined above. It is apparent that physisorption only takes place on the surface of the nanoparticles. Without being bound to theory, it is believed the metal salts act as a dispersant. In the context of the present inventions, metal salts are therefore termed dispersants. The amount of metal salts physisorbed on the surface may vary over a broad range. Suitable amount of metal salts are in the range of 0.02-6 mol %, preferably 0.1-4 mol %, most preferably 0.2-2 mol % molar fraction of metal salt cation to metal atoms/ions in the nanoparticle. These amounts depend on the specific surface exhibited by the nanoparticles and may be determined by the skilled person.

In one embodiment, the metal salt is of formula (I)

$$M_z^{a+} R_y^{b-} \qquad (I)$$

wherein

M represents a metal cation,

R represents the corresponding salt anion, a is 2, 3, 4 or 5, preferably 2 or 3 b is 1, 2 or 3, preferably 1 or 2 z is 1, or a real number below 1 but excluding 0, y is z*a/b

The metal cation (M) is preferably Zn, Al, Y, Pb, Bi, Cu, Ni, Co, Fe, Mn, Cr, V, Ti, La, Mg, Ca, Sr or Ba and is most preferably Zn, Al or Y.

The salt ion (R) is preferably acetate, formiate, citrate, oxalate, nitrate or halogenide and is most preferably acetate or nitrate.

In a preferred embodiment, the metal atom/ion of the dispersant salt differs from the metal atom/ion which is present in the major concentration in the nanoparticle.

In a preferred embodiment, the metal atom/ion of the dispersant salt differs from any metal atom/ion present in the nanoparticle which is present in a concentration larger than 0.1 wt % (relative to the nanoparticle composition)

The metal salts described herein are commercial items. Such metal salts may be made by any method known in the art.

In one embodiment, the invention provides a buffer layer with a composition as described herein wherein said layer consists of metal oxide nanoparticles and a dispersant as described herein.

In one embodiment, said metal oxide nanoparticles are coated with one type of dispersant as defined herein.

In one alternative embodiment, said metal oxide nanoparticles are coated with two or more types of dispersant as defined herein. In this embodiment, either an individual nanoparticle is coated with said two or more types of dispersant or a first group on nanoparticles is coated with a first dispersant, a second group of nanoparticles is coated with a second dispersant and so on.

In a further embodiment, the invention provides a buffer layer with the following composition: 70-99.9 wt %, preferably 80-99.5 wt %, most preferably 90-99 wt % metal oxide nanoparticles and 0.1-30 wt % metal salt, preferably 0.5-20 wt % metal salt, most preferably 1-10 wt % metal salt. These ratios are preferably measured by secondary ion mass spectrometry (SIMS) techniques (eg. TOF-SIMS).

In an advantageous embodiment, the invention provides a buffer layer as described herein containing 70-99.9 wt %, preferably 80-99.5 wt %, most preferably 90-99 wt % NiO nanoparticles and 0.1-30 wt %, preferably 0.5-20 wt %, most preferably 1-10 wt % dispersant.

In an advantageous embodiment, the invention provides a buffer layer as described herein containing 70-99.9 wt %, preferably 80-99.5 wt %, most preferably 90-99 wt % ZnO nanoparticles and 0.1-30 wt %, preferably 0.5-20 wt %, most preferably 1-10 wt % dispersant.

In an advantageous embodiment, the invention provides a buffer layer as described herein containing 70-99.9 wt %, preferably 80-99.5 wt %, most preferably 90-99 wt % AZO nanoparticles and 0.1-30 wt %, preferably 0.5-20 wt %, most preferably 1-10 wt % dispersant.

In an advantageous embodiment, the invention provides buffer layers as described herein comprising:
NiO nanoparticles and $Y(NO_3)_3$ salt of formula (I); or
ZnO nanoparticles and $Y(NO_3)_3$ salt of formula (I); or
AZO nanoparticles and $Y(NO_3)_3$ salt of formula (I).

In a further embodiment, the invention provides an electronic device as described herein wherein said buffer layers have a film thickness of 3-1000 nm, preferably 10-500 nm. In one embodiment, monolayers, typically 3-30 nm thick are also envisaged. Thickness may be determined by profilometry, atomic force microscopy or electron microscopy.

In a further embodiment, the invention provides an optoelectronic device as described herein wherein said oxide nanoparticles have a primary particle diameter of 1-100 nm, preferably 3-50 nm (measured by nitrogen absorption, X-Ray diffraction or transmission electron microscopy).

In a further embodiment, the invention provides an electronic device as described herein wherein said oxide nanoparticles exhibit a bimodal or multimodal size distribution. It is believed that bimodal or multimodal size distributions result in higher particle packing densities, thus resulting in lower layer porosity.

In a further embodiment, the invention provides an electronic device as described herein wherein said buffer layers have a mean surface roughness below 100 nm, especially below 30 nm (determined by electron microscopy, atomic force microscopy or profilometry).

In a further embodiment, the invention provides an electronic device as described herein wherein said buffer layer comprises, in addition to the nanoparticles as described herein, scattering particles. Accordingly, buffer layers of the present invention may additionally comprise scattering particles, typically having a refractive index of >2.3 and being comparatively large, typically with a particle size of 100-500 nm. The presence of such scattering particles provides for controlled Haze to an electronically functional buffer layer. The use of such buffer layers with light scattering properties (Haze) is for light extraction (light outcoupling) in OLED devices or for light incoupling in solar cells, which enhances the efficiency of either device (more light gets into solar cell or more light is extracted from an OLED). Typical compositions of scattering particles are BaTiO3, SrTiO3, TiO2. Typical concentrations of scattering particles in the dry buffer layer range from 5-50 wt %.

In a further embodiment, the invention provides an electronic device as described herein wherein said buffer layer has an electrical conductivity of $10^{-8}$-$10^3$ S/cm, preferably $10^{-6}$-$10^2$, most preferably $10^{-3}$-10 (determined by 4-point conductivity measurement).

In a more specific embodiment, the invention provides an electronic device as described herein wherein said buffer layer comprises scattering particles and has an electrical conductivity of $10^{-1}$-$10^3$ S/cm.

In a further embodiment, the invention relates to an OLED wherein the ETL or EIL (i) is obtained by a method as described herein or (ii) consists of metal oxide nanoparticles coated with a dispersant as described herein.

In a further embodiment, the invention relates to an OLED wherein the HTL or HIL (i) is obtained by a method as described herein or (ii) consists of metal oxide nanoparticles coated with a dispersant as described herein.

In a further embodiment, the invention relates to an OLED wherein the device stack comprises the sequence electrode/HIL/HTL/active layer/ETL/EIL/electrode.

In a further embodiment, the invention relates to an OLED wherein the ETL layer consists of a monolayer of nanoparticles coated with a dispersant as described herein.

In a further embodiment, the invention relates to an organic solar cell (OPV) wherein the ETL (i) is obtained by a method as described herein or (ii) consists of metal oxide nanoparticles coated with a dispersant as described herein.

In a further embodiment, the invention relates to a perovskite solar cell wherein the HTL (i) is obtained by a method as described herein or (ii) consists of metal oxide nanoparticles coated with a dispersant as described herein.

In a further embodiment, the invention relates to an organic photodetector wherein the ETL (i) is obtained by a method as described herein or (ii) consists of metal oxide nanoparticles coated with a dispersant as described herein.

In a further embodiment, the invention relates to an electronic device wherein the ETL (i) is obtained by a method as described herein or (ii) consists of metal oxide nanoparticles coated with at least one type of a dispersant as described herein.

Use:
In a further embodiment, the invention relates to the use of metal oxide nanoparticles coated with metal salts as described herein for manufacturing an electronic device as described herein, particularly selected from the group of OLEDs, OPVs, perovskite type solar cells, photodetectors and QLEDs.

In a second aspect, the invention relates to an intermediate good ("a component") comprising a sheet-like substrate coated with a multitude of layers wherein at least one of said layers, preferably a buffer layer, comprises nanoparticles with physisorbed metal salts as defined in the first aspect of the invention.

This aspect of the invention shall be explained in further detail below.

Intermediate good ("component"): As outlined above, there is a need for manufacturing organic electronics by solution based processes. Accordingly, a component is manufactured by suitable solution based processes, such as coating or printing; the thus obtained material is then finished to obtain the final device (the organic electronic).

In one embodiment, the invention provides a component as defined herein, wherein said layers have the sequence substrate/electrode/HTL/active layer/ETL/electrode. ("normal architecture").

In one further embodiment, the invention provides a component as defined herein, wherein said layers have the sequence substrate/electrode/ETL/active layer/HTL/electrode. ("inverted architecture").

In one further embodiment, the invention provides a component as defined herein, wherein said layers comprise the sequence electrode/ETL/active layer/HTL. This intermediate may also be the basis of a tandem cell.

In one further embodiment, the invention provides a component as defined herein, wherein said layers comprise the sequence electrode/HTL/active layer/ETL. This intermediate may also be the basis of a tandem cell.

In one further embodiment, the invention provides a component as defined herein, wherein said layers comprise the sequence electrode/HTL/ETL/electrode.

In one further embodiment, the invention provides a component as defined herein, wherein said layers comprise the sequence electrode/ETL/HTL/electrode.

In one further embodiment, the invention provides a component as defined herein, wherein said layers have the sequences:
(a) Transparent electrode/HTL/active layer/ETL
(b) Non-transparent electrode/HTL/active layer/ETL
(c) Transparent electrode/ETL/active layer/HTL
(d) Non-transparent electrode/ETL/active layer/HTL, whereby the transparent electrode is selected from the group consisting of: PEDOT:PSS, Metal nanowires (including Silver nanowires, Copper nanowires, Nickel nanowires), metal grids, Graphene, Carbon nanotubes and ITO; and whereby the non-transparent electrode is selected from the group consisting of dense silver, dense aluminum, dense copper, dense gold, thick (opaque) carbon nanotube layer and thick (opaque) graphene-based layer.

In one further embodiment, the invention provides a component as defined herein, wherein no additional layer is present.

In one further embodiment, the invention a component as defined herein, wherein the buffer layer has a thickness between 3-1000 nm, preferably 10-500 nm.

In one further embodiment, the invention provides a component as defined herein, wherein the buffer layer has a mean surface roughness below 30 nm.

In one further embodiment, the invention provides a component as defined herein, wherein the buffer layer has a metal salt content in the range of 0.1-30 wt %, preferably 0.5-20 wt %, most preferably 1-10 wt %.

In one further embodiment, the invention provides a component as defined herein, the substrate is as defined above.

Use:

In one further embodiment, the invention provides for the use of metal oxide nanoparticles comprising physisorbed metal salts as described herein for manufacturing of an intermediate good ("component") as defined herein.

In a third aspect, the invention relates to a composition in the form of a suspension, said composition containing metal oxide nanoparticles, solvent(s) and a dispersant selected from the group of metal salts as described herein. The use of such suspensions for manufacturing thin films, such as buffer layers, is novel and subject of the present invention. Further, certain suspensions are novel and thus also subject of the present invention. This aspect of the invention shall be explained in further detail below.

New Uses:

The invention provides for the use of a suspension, comprising metal oxide nanoparticles coated with a dispersant as described herein and a polar solvent, (i) for manufacturing of an intermediate good ("component") as defined herein or (ii) for manufacturing an electronic device as described herein; said device particularly selected from the group of OLEDs, OPVs, perovskite type solar cells, photodetectors and QLEDs.

For these uses, suitable suspensions (II) comprise 0.2-50 wt-%, preferably 1-20 wt % nanoparticles (1) as described herein; 0.005-10 wt-%, preferably 0.01-5 wt-metal salt (2) as described herein; 20-99.795 wt-%, preferably 30-98.99 wt-% solvent (4) as defined above, preferably water, dimethyl sulfoxide, dimethyl formamide, dimethyl acetamide, methanol, acetonitrile, ethylene glycol, propylene carbonate, acetone, 2,2,3,3-tetrafluoro-1-propanol, most preferably methanol, acetonitrile, 2,2,3,3-tetrafluoro-1-propanol and water.

New Suspensions:

Further, certain of the above defined suspensions are novel and thus subject of the present invention. The term suspension is defined above.

In one embodiment, the invention provides for a composition in the form of a suspension comprising (i) nanoparticles selected from the group of metal oxide nanoparticles and (ii) one or more solvents and (iii) one or more dispersants from the group of metal salts as described herein.

Nanoparticles:

The amount of nanoparticles in the inventive composition may—depending on the intended use—vary over a broad range, but typically is in the range of 0.2-50 wt % (preferably 1-20 wt %) of the composition.

Advantageously, the nanoparticles in suspension have a hydrodynamic size $D_{90}$ of less than 100 nm (measured by dynamic light scattering or centrifugal sedimentation techniques).

Advantageously, the nanoparticles are synthesized by a gas phase pyrolysis process, preferably flame spray synthesis.

Dispersants:

Suitable dispersants are discussed above and particularly include metal salts of formula (I). Without being bound to theory, it is believed that the dispersants in the inventive suspension are partly physisorbed on the nanoparticles surface and partly dissolved in the solvent.

Solvents:

Suitable solvents include polar solvents as discussed above, and are preferably selected from the group consisting of water, dimethyl sulfoxide, dimethyl formamide, dimethyl acetamide, methanol, acetonitrile, ethylene glycol, propylene carbonate, acetone, and 2,2,3,3-tetrafluoro-1-propanol. Particularly preferred are polar solvents selected from the group consisting of methanol, acetonitrile, 2,2,3,3-tetrafluoro-1-propanol and water. It is understood that the term solvent also comprises combinations of the named above solvents.

In a forth aspect, the invention relates to the manufacturing of the inventive compositions, intermediate goods and devices disclosed herein and to inventive compositions, intermediate goods and devices obtained according to these methods. This aspect of the invention shall be explained in further detail below.

Manufacturing of Suspensions:

The manufacturing of suspensions is a known procedure. The coating of nanoparticles is also a known procedure. These procedures may be applied to the starting materials of the inventive suspensions.

In one embodiment, solvent and nanoparticles are combined, for example by mixing, ultrasonication or ball milling. To the obtained initial suspension, the dispersants (i.e. metal salts) are added. Coating takes place at room temperature or upon heating and mixing.

In one alternative embodiment, solvent and dispersants (i.e. metal salts) are combined, for example by mixing. To the obtained initial solution, the nanoparticles are added. Coating takes place at room temperature or upon heating and mixing.

Manufacturing of Intermediate Goods:

The intermediate goods according to the present invention may be obtained by solution processes. This is considered a significant advantage, as it enables manufacturing of all layers by simple technologies applicable to large areas and continuous processing.

In one embodiment, the invention provides for a method for manufacturing an intermediate good as defined herein, wherein the buffer layer is manufactured comprising the steps of (a) applying a suspension on a substrate or coated substrate, said suspension comprising metal oxide nanoparticles coated with a dispersant and a solvent and removing the solvent from said composition and (b) removing the solvent from the obtained thin film and (c) optionally treating the dry layer at elevated temperature.

Step (a) Application of a suspension: Many processes are known to apply a liquid composition to a substrate to result in a wet thin film; a person skilled in the art is in a position to appropriately select. Suitable are, for example coating, particularly roll-to-roll-, slot-die-, spray-, ultrasonic spray-, dip-, reel-to-reel-, blade-coating; or by printing, particularly ink-jet-, pad-, offset-, gravure-, screen-, intaglio-, sheet-to-sheet-printing. Such processes are generally considered advantageous for large scale production, when compared to vacuum-based processes. Depending on the composition used in step (a), this step may be repeated (i.e. may be performed multiple times). This embodiment is considered advantageous in order to fine tune the final film thickness.

Step (b) Drying and film formation: Many processes are known to remove a liquid from a wet thin film of a coated substrate; a person skilled in the art is in a position to appropriately select. Suitable are, for example drying at room temperature or elevated temperature. Drying may take place in air, in a protecting gas, such as nitrogen or argon. Especially suited are gases with low humidity content (e.g. nitrogen, dry air, argon).

Step (c): Temperature cleaning step: A cleaning step in the form of a temperature annealing can optionally be conducted at temperatures below 150° C. In an advantageous embodiment, the dried nanoparticle film in step (c) is annealed at 80° C.-150° C. in air or in a protecting gas. In an advantageous embodiment, all layers of the intermediate good are manufactured by coating or printing.

Manufacturing of Devices:

The manufacturing of devices starting from the above described intermediate goods is known per se, but not yet applied to the specific intermediate goods of the present invention.

Accordingly, the invention provides a method for manufacturing an electronic device as defined herein comprising the steps of (a) providing an intermediate good as defined herein, (b) contacting the layers of said good with an electrical circuit, (d) finishing the obtained product.

Product by Process:

Due to the novel buffer layer obtained according to the inventive method, the electronic devices and intermediate goods are also novel. Due to the outstanding stability and performance obtained according to the inventive method, the suspensions are also novel. The invention thus provides for a suspension obtained by a method comprising the step of combining metal oxide nanoparticles, dispersant(s) and solvent(s).

The invention thus provides for an intermediate good, obtained by a method comprising the steps of applying a suspension on a substrate or coated substrate, said suspension comprising (i) metal oxide nanoparticles coated with a dispersant and (ii) a solvent and removing the solvent from said composition and optionally treating the dry layer at elevated temperature.

The invention thus provides an electronic device, obtained by a method comprising the steps of providing an intermediate good as defined herein, contacting the layers with an electrical circuit, finishing the obtained product.

To further illustrate the invention, the following examples are provided. These examples are provided with no intent to limit the scope of the invention.

Example 1

Nickel oxide (NiO) nanoparticles were synthesized by flame spray synthesis. For the preparation of the precursor, 269.2 g Ni-acetate tetrahydrate (Sigma Aldrich) was added to 1080 g 2-ethylhexanoic acid (Aldrich) and dissolved by heating the mixture for 1 hour at 150° C. To the obtained solution, 540 g tetrahydrofuran (Sigma Aldrich) was added and well mixed. The precursor then was fed (7 ml min$^{-1}$, HNP Mikrosysteme, micro annular gear pump mzr-2900) to a spray nozzle, dispersed by oxygen (15 l min$^{-1}$, PanGas tech.) and ignited by a premixed methane-oxygen flame ($CH_4$: 1.2 l min$^{-1}$, $O_2$: 2.2 l min$^{-1}$). The off-gas was filtered through a glass fiber filter (Schleicher & Schuell) by a vacuum pump (Busch, Seco SV1040CV) at about 20 m$^3$ h$^{-1}$. The obtained oxide nanopowder was collected from the glass fiber filter.

The mean crystallite size was measured with a Rigaku MiniFlex 600, an SC-70 Detector, measured from 10° to 70° at 0.01° step size by using the Scherrer equation. The mean crystallite size of the SrTiO3 particles was 10 nm.

For the preparation of suspensions, 5 wt % of NiO nanopowder (as described above), 0.1 wt % of Yttrium(III) nitrate hexahydrate (Aldrich) and 94.9 wt % methanol (Merck) were dispersed by ball-milling for 1 hour. The finally prepared suspension is black and stable for more than 1 week (no supernatant visible after 1 week).

For the device fabrication the patterned ITO substrates were subsequently ultrasonic cleaned with acetone and isopropanol for 10 minutes each. On cleaned ITO substrate, a dense and smooth layer of the above described NiO-suspension was deposited by spin coater at a speed of 4000 and followed by annealing at 140° C. for 15 minutes in air leading to a dry film thickness of ~30 nm. The following steps were conducted in a nitrogen glovebox: $PbI_2$ and $CH_3NH_3I$ mixed with mole ratio of 1:1 with a concentration of ~40% were stirred in a mixture of dimethylformamide and dimethyl sulfoxide (2:1 v/v) at 60° C. for 12 h. The as-prepared perovskite precursor solution was filtered using 0.45 µm PTFE syringe filter and coated onto the ITO/NiO substrate at a speed of 4,000 r.p.m for 35 s. During the last 5 s of the whole spinning process, the substrate (around 2.5 cm×2.5 cm) was treated with chlorobenzene (CB) dropcasting. The substrate was dried on a hot plate at 100° C. for 10 min. A 2 wt % PCBM solution in CB was spin-coated on the ITO/NiO/MAPbI3 substrate at 1200 r.p.m for s. Finally, a 100-nm-thick Ag counter electrode was deposited through a shadow mask by thermal evaporation.

Device characterizations: J-V characteristics of all the devices were measured using a source measurement unit from BoTest. Illumination was provided by a Newport SollA solar simulator with AM1.5G spectrum and light intensity of 100 mWcm-2, which was determined by a calibrated crystalline Si-cell. During device characterization, a shadow mask with an opening of 10.4 mm2 was used. The EQE spectra were recorded with by an Enli Technology (Taiwan) EQE measurement system (QE-R), and the light intensity at each wavelength was calibrated with a standard single-crystal Si photovoltaic cell. The cell prepared as described above reached a photoconversion efficiency (PCE) of 13.98% with a short circuit current of 19.22 mA/cm$^2$, a open circuit voltage of 1.10 V and a fill factor of 66.2%.

Example 2

5 wt % of the NiO-nanopowder from experiment 1, 0.5 wt % Diethylphosphato-ethyl-triethoxysilane (ABCR) and 94.5 wt % of isopropanol (BASF) were dispersed by ball-milling for 1 hour. The finally prepared suspension is black and stable for more than 1 week (no supernatant visible after 1 week).

Devices produced as described in experiment 1 reached a photoconversion efficiency (PCE) of 1.60% with a short circuit current of 3.30 mA/cm$^2$, a open circuit voltage of 1.08 V and a fill factor of 44.9%.

Example 3

A variety of combinations of different types of nanopowders, metal salts and solvents were used for preparing suspensions. 5 wt % of nanopowder, 0.25 wt % of metal salt and 94.75 wt % of solvent were dispersed by ball-milling for 15 minutes. The nanopowders were either prepared similarly to experiment 1 or were commercially available. The metal salts as well as solvents were all commercially available. The hereby prepared suspensions were evaluated after 3 days. The suspensions were considered instable if there was a phase separation such that there was a clear supernatant of 30% or more in height regarding to the total suspension filling height and were considered stable if less than 30% in height. The results are shown in the following table:

| Nanopowder (metal oxide) | Metal Salt (I) (disperant) | Solvent | Result |
|---|---|---|---|
| $TiO_2$ | Yttrium(III) nitrate hexahydrate | Methanol | stable |
| $ZrO_2$ | Yttrium(III) nitrate hexahydrate | Methanol | stable |
| $Y_2O_3$ | Yttrium(III) nitrate hexahydrate | Methanol | stable |
| $Nb_2O_5$ | Yttrium(III) nitrate hexahydrate | Methanol | stable |
| $Ta_2O_5$ | Yttrium(III) nitrate hexahydrate | Methanol | stable |
| NiO | Calcium(II) acetate hydrate | Methanol | stable |
| NiO | Lanthanum (III) nitrate hexahydrate | Methanol | stable |
| NiO | Aluminum chloride | Methanol | stable |
| NiO | Yttrium(III) nitrate hexahydrate | Water | stable |
| NiO | Yttrium(III) nitrate hexahydrate | Dimethyl sulfoxide | stable |
| NiO | Yttrium(III) nitrate hexahydrate | 1,2-Propanediol | stable |
| NiO | Yttrium(III) nitrate hexahydrate | Ethanol | stable |
| NiO | Yttrium(III) nitrate hexahydrate | Ethylene glycol | stable |
| NiO | Aluminum nitrate nonahydrate | Methanol | stable |
| ZnO | Zinc acetate | 2,2,2,3-Tetrafluoro-1-propanol | stable |
| AZO | Zinc acetate | 2,2,2,3-Tetrafluoro-1-propanol | stable |
| $Y_2O_3$ | Zinc acetate | Methanol | stable |
| $Y_2O_3$ | Yttrium(III) acetate hydrate | Methanol | stable |

Example 4

5 wt % of the NiO-nanopowder from experiment 1, various amounts of Yttrium(III) nitrate hexahydrate (Aldrich) and methanol (Merck) were dispersed by ball-milling for 15 minutes. Stability was evaluated similar to Example 3. The following results were found: Suspension containing 0.005 wt % and 0.025 wt % of Yttrium(III) nitrate hexahydrate were found to be not stable (corresponding to 0.1 and 0.5 wt %, respectively), while a suspension containing 0.05 wt % or more of Yttrium(III) nitrate hexahydrate (corresponding to 1 wt %) were found to be stable.

Example 5

Comparative example between this invention and Kim et al (Nanoscale Research Letters 2014, 9, 323).

Figure 5:
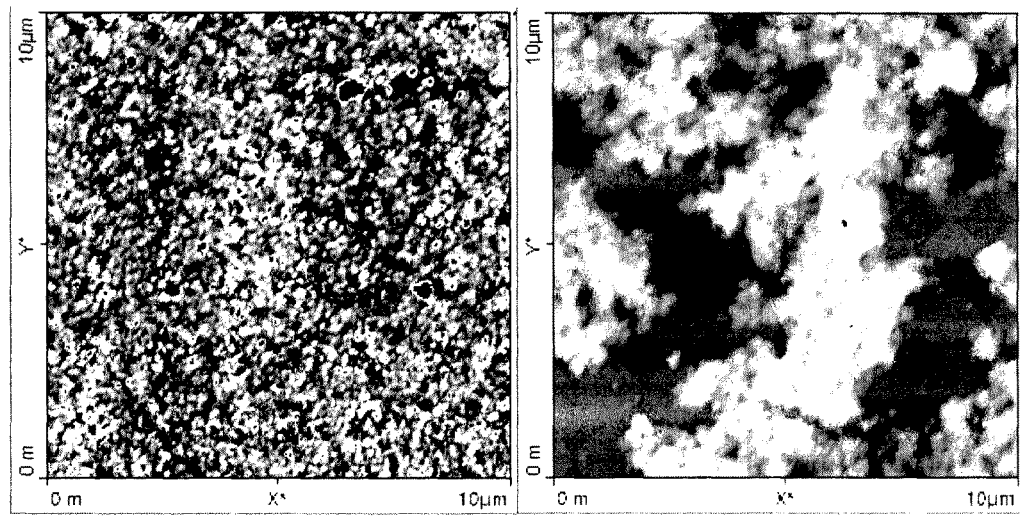
FIG. 5 shows atomic force micrographs (10×10 micrometers) of films obtained according to example 5, left: this invention, right according to the prior art.

Experimental 5 wt % nanoparticles (ZnO; synthesized by flame spray pyrolysis) are dispersed in the solvent (ethanol or methanol) in the presence of 5 wt % dispersant (metal salt: Cs2CO3 (according to Kim) or YNO3x6H2O (this invention), total dispersant concentration:0.25%). The suspensions are prepared in analogy to example 4. Film coating was effected with a spin coater @5000 rpm. Particle size was determined with LUMISIZER by dissolution to 0.5 wt % ZnO in methanol. The results are provided below and in FIG. 5.

Results:

TABLE 1

| Solvent ethanol | | |
|---|---|---|
| | Y(NO3)3x6H2O | Cs2CO3 |
| Dispersion | | |
| appearance of dispersion | very turbid not stable: sedimentation within 5 min | very turbid not stable: sedimentation within 5 min |

TABLE 2

| Solvent methanol | | |
|---|---|---|
| | Y(NO3)3x6H2O This invention | Cs2CO3 for comparison |
| Dispersion | | |
| appearance of dispersion: particle size:* | stable, no sedimentation for at least 3 hours 80 nm | not stable, sedimentation within 5 min 2049 nm |
| Film | | |
| appearance of film Coating: Film roughness: | transparent, homogeneous films after coating Ra = 5.6 nm | hazy, inhomogeneous films after coating Ra = 37.8 nm |

* average hydrodynamic particle size in dispersion (D50; nm)

Conclusion

The data provided in this example convincingly show that nanoparticles coated with Cs2CO3 [corresponding to metal salts of formula (I) where a=1] are unsuited to prepare stable suspensions and also result in films with high roughness.

The data provided in this example further show that the same nanoparticles coated with Y(NO3)3 [corresponding to metal salts of formula (I) where a=3] are suited to prepare stable suspensions with polar solvents and also result in films with low roughness.

Optoelectronic devices comprising inventive nanoparticles are superior when compared to devices comprising known nanoparticles.

The invention claimed is:

1. An optoelectronic device,
wherein said device comprises a substrate and a multitude of layers,
wherein at least one of said layers is a buffer layer,
wherein said buffer layer comprises 70-99.9 wt % metal oxide nanoparticles,
wherein metal oxide nanoparticles comprise physisorbed metal salts of formula (I) in an amount of 1-10 wt %,

   (I), wherein
M represents a metal cation, selected from the group consisting of Zn, Al, Y, Pb, Bi Cu, Ni, Co, Fe, Mn, Cr, V, Ti, La, Mg, Ca, Sr or Ba,
R represents the corresponding salt anion,
a is 2, 3, 4 or 5,
b is 1, 2 or 3,
z is 1, or a real number below 1 but excluding 0,
y is z*a/b; and
wherein the molar fraction of metal salt cation to metal atoms/ions in the nanoparticle is 0.02-6 mol %.

2. The device according to claim 1, selected from the group consisting of perovskite solar cells, OPV cells, OLEDs, QLEDs and organic photodetectors.

3. The device according to claim 2, selected from the group of OPV and perovskite solar cells, wherein said multitude of layers is arranged in normal architecture or in inverted architecture; or
selected from the group of LEDs where the active layer comprises organic materials (OLED) or where the active layer comprises quantum dots (QLED).

4. The device according to claim 1, wherein said buffer layer is selected from the group consisting of hole transport (HTL), hole injection (HIL), hole extraction (HEL), electron transport (ETL), electron injection (EIL) and electron extraction (EEL) layers.

5. The device according to claim 1, wherein said metal oxide nanoparticles are selected from the group consisting of
pure metal oxides;
mixed metal oxides;
doped metal oxides.

6. The device of claim 5, wherein:
the pure metal oxides are selected from the group consisting of NiO, ZnO, $W_zO_y$, $MO_zO_y$, $Ti_zO_y$, $Y_zO_y$, $Ta_zO_y$, $Nb_zO_y$, CuO, $Cr_zO_y$ and $V_zO_y$;
the mixed metal oxides are selected from the group consisting of IGZO, IZO, $ZnSnO_3$ and $BaSnO_3$; and
the doped metal oxides are selected from the group consisting of AZO, ITO and ATO.

7. The device according to claim 1, wherein said metal oxide nanoparticles are selected from the group consisting of NiO, ZnO, Al-doped ZnO ("AZO"), $TiO_2$ and doped $TiO_2$.

8. The device according to claim 1, wherein
R represents an organic anion, citrate, oxalate; or an inorganic anion.

9. The device of claim 8, wherein R represents an organic anion selected from Acetate, formiate, citrate, oxalate; or an inorganic anion selected from nitrate and halogenide.

10. The device according to claim 1, wherein
$M_z^{a+}$ is $Zn^{2+}$, $Al^{3+}$, or $Y^{3+}$; and
$M_z^{a+}R_y^{b-}$ is zinc acetate, aluminium acetate, yttrium acetate, zinc nitrate, aluminium nitrate, or yttrium nitrate.

11. The device according to claim 1, wherein said substrate is selected from
(a) an organic material; or
(b) an inorganic material; or
(c) a combination of (a) and (b).

12. A composition in the form of a suspension comprising
(a) 0.2-50 wt % metal oxide nanoparticles selected from the group consisting of
pure metal oxides,
mixed metal oxides, and
doped metal oxides;
(b) 0.005-10 wt % metal salts as defined in claims 1;
(c) 20-99.795 wt % polar solvents.

13. A method for manufacturing an optoelectronic device according to claim 1 comprising the steps of
(a) providing an intermediate good comprising a sheet-like substrate coated with a multitude of layers;
wherein at least one layer is a buffer layer (hole extraction (HEL), electron extraction (EEL), hole injection (HIL));
wherein said layers
(i) have the sequence substrate/electrode/HTL/active layer/ETL/electrode ("normal architecture"); or (ii) have the sequence substrate/electrode/ETL/active layer/HTL/electrode ("inverted architecture"); or
(iii) comprise the sequence electrode/ETL/active layer/HTL; or
(iv) comprise the sequence electrode/HTL/active layer/ETL; or
(v) comprise the sequence electrode/HTL/ETL/Electrode; or
(vi) comprise the sequence electrode/ETL/HTL/electrode,
(b) contacting the layers of said intermediate good with an electrical circuit, and
(c) finishing the obtained product.

14. An intermediate good comprising a sheet-like substrate coated with a multitude of layers;
wherein at least one layer is a buffer layer (hole extraction (HEL), electron extraction (EEL), hole injection (HIL));
wherein said layers
(a) have the sequence substrate/electrode/HTL/active layer/ETL/electrode ("normal architecture"); or
(b) have the sequence substrate/electrode/ETL/active layer/HTL/electrode ("inverted architecture"); or
(c) comprise the sequence electrode/ETL/active layer/HTL; or
(d) comprise the sequence electrode/HTL/active layer/ETL; or
(e) comprise the sequence electrode/HTL/ETL/Electrode; or
(f) comprise the sequence electrode/ETL/HTL/electrode,
wherein said buffer layer(s) contain metal oxide nanoparticles
comprising physisorbed metal salts of formula (I) in an amount of 1-10 wt %, $$M_z^{a+} R_y^{b-} \qquad (I),$$

wherein
M represents a metal cation, selected from the group consisting of Zn, Al, Y, Pb, Bi Cu, Ni, Co, Fe, Mn, Cr, V, Ti, La, Mg, Ca, Sr or Ba,
R represents the corresponding salt anion,
a is 2, 3, 4 or 5,
b is 1, 2 or 3,
z is 1, or a real number below 1 but excluding 0,
y is z*a/b; and
wherein the molar fraction of metal salt cation to metal atoms/ions in the nanoparticle is 0.02-6 mol %.

15. The intermediate good of claim 14, wherein
the buffer layer is free of scattering particles and has a thickness between 3-1000 nm or the buffer layer comprises scattering particles and has a thickness between 100-20000 nm; and/or
the buffer layer has a mean surface roughness below 30 nm; and/or
the electrode is selected from the group of ITO, silver, copper, nickel or PEDOT:PSS; and/or
at least one of the electrodes is based on silver; and
no additional layer is present.

16. A method for manufacturing an intermediate good according to claim 14, wherein the buffer layer is manufactured comprising the steps of
(a) applying a suspension on a substrate or a coated substrate, said suspension comprising the metal oxide nanoparticles, and (ii) a polar solvent
(b) removing the solvent from said composition and
(c) optionally treating the dry layer at elevated temperature.

17. The method of claim 16, wherein
(a) the suspension of step (a) is applied by coating or printing; and/or
(b) the solvent of step (b) is removed under air or a protecting gas with a low humidity content; and/or
(c) the dried nanoparticle film in step (c) is annealed at 50° C.-150° C. in air or in a protecting gas.

18. The method of claim 16, wherein all layers are manufactured by coating or printing.

19. An intermediate good, obtained by a method according to claim 16.

20. An electronic device, obtained by a method comprising the steps of
(a) providing an intermediate good according to claim 14,
(b) contacting the layers with an electrical circuit, and
(c) finishing the obtained product.

* * * * *